(12) United States Patent
Nemani et al.

(10) Patent No.: US 11,114,333 B2
(45) Date of Patent: Sep. 7, 2021

(54) METHOD FOR DEPOSITING AND REFLOW OF A HIGH QUALITY ETCH RESISTANT GAPFILL DIELECTRIC FILM

(71) Applicant: Micromaterials LLC, Wilmington, DE (US)

(72) Inventors: Srinivas D. Nemani, Sunnyvale, CA (US); Ellie Y. Yieh, San Jose, CA (US); Chentsau Ying, Cupertino, CA (US)

(73) Assignee: Micromaterials, LLC, Wilmington, DE (US)

( * ) Notice: Subject to any disclaimer, the term of this patent is extended or adjusted under 35 U.S.C. 154(b) by 0 days.

(21) Appl. No.: 16/279,598

(22) Filed: Feb. 19, 2019

(65) Prior Publication Data

US 2019/0259625 A1 Aug. 22, 2019

Related U.S. Application Data

(60) Provisional application No. 62/633,935, filed on Feb. 22, 2018.

(51) Int. Cl.
*H01L 21/76* (2006.01)
*H01L 21/768* (2006.01)
(Continued)

(52) U.S. Cl.
CPC ........ *H01L 21/76801* (2013.01); *C23C 16/30* (2013.01); *C23C 16/56* (2013.01);
(Continued)

(58) Field of Classification Search
CPC ......... H01L 21/31051; H01L 21/68742; H01L 21/68771; H01L 21/67109;
(Continued)

(56) References Cited

U.S. PATENT DOCUMENTS 5,405,802 A * 4/1995 Yamagata ......... H01L 21/30604
148/33.5
5,851,892 A * 12/1998 Lojek ................ H01L 21/31662
438/305

(Continued)

FOREIGN PATENT DOCUMENTS

| JP | H0567607 A | 3/1993 |
|---|---|---|
| JP | H10275805 A | 10/1998 |
| KR | 20050052994 A | 6/2005 |

OTHER PUBLICATIONS

Office Action for Korean Application No. 10-2019-0020360 dated Jun. 5, 2020.
(Continued)

*Primary Examiner* — Shouxiang Hu
(74) *Attorney, Agent, or Firm* — Patterson + Sheridan, LLP

(57) ABSTRACT

Methods for depositing a gapfill dielectric film that may be utilized for multi-colored patterning processes are provided. In one implementation, a method for processing a substrate is provided. The method comprises filling the one or more features of a substrate with a dielectric material. The dielectric material is a doped silicate glass selected from borophosphosilicate glass (BPSG), phosphosilicate glass (PSG), and borosilicate glass (BSG). The method further comprises treating the substrate with a high-pressure anneal in the presence of an oxidizer to heal seams within the dielectric material. The high-pressure anneal comprises supplying an oxygen-containing gas mixture on a substrate in a processing chamber, maintaining the oxygen-containing gas mixture in the processing chamber at a process pressure at greater than 2 bar and thermally annealing the dielectric material in the presence of the oxygen-containing gas mixture.

20 Claims, 3 Drawing Sheets

(51) Int. Cl.
| | |
|---|---|
| *H01L 21/3105* | (2006.01) |
| *H01L 21/02* | (2006.01) |
| *C23C 16/56* | (2006.01) |
| *H01L 21/033* | (2006.01) |
| *C23C 16/30* | (2006.01) |
| *H01L 21/687* | (2006.01) |
| *H01L 21/67* | (2006.01) |

(52) U.S. Cl.
CPC .. *H01L 21/02129* (2013.01); *H01L 21/02271* (2013.01); *H01L 21/02323* (2013.01); *H01L 21/02337* (2013.01); *H01L 21/0332* (2013.01); *H01L 21/0337* (2013.01); *H01L 21/3105* (2013.01); *H01L 21/31051* (2013.01); *H01L 21/6719* (2013.01); *H01L 21/67103* (2013.01); *H01L 21/67109* (2013.01); *H01L 21/67126* (2013.01); *H01L 21/67248* (2013.01); *H01L 21/68742* (2013.01); *H01L 21/68771* (2013.01); *H01L 21/76828* (2013.01)

(58) Field of Classification Search
CPC ........... H01L 21/67126; H01L 21/3105; H01L 21/6719; H01L 21/0337; H01L 21/02337; H01L 21/67248; H01L 21/67103; H01L 21/02323; H01L 21/02129; H01L 21/0332; H01L 21/02271; H01L 21/76837; H01L 21/31625; H01L 21/76801; H01L 21/76828
See application file for complete search history.

(56) References Cited

U.S. PATENT DOCUMENTS

| | | | |
|---|---|---|---|
| 6,319,847 | B1 | 11/2001 | Ishikawa |
| 6,514,876 | B1* | 2/2003 | Thakur ............. H01L 21/31051 257/E21.243 |
| 8,735,252 | B2 | 5/2014 | Yu et al. |
| 9,570,307 | B2 | 2/2017 | Nainani et al. |
| 9,865,735 | B2 | 1/2018 | Sun et al. |
| 2005/0118833 | A1 | 6/2005 | Mitsumune et al. |
| 2008/0160783 | A1* | 7/2008 | Watanabe ......... H01L 21/76837 438/763 |
| 2015/0294863 | A1 | 10/2015 | Nemani et al. |

OTHER PUBLICATIONS

Final Office Action for Korean Application No. 10-2019-0020360 dated Apr. 19, 2021.
Final Office Action for Korean Application No. 10-2019-0020360 dated Dec. 15, 2020.

* cited by examiner

METHOD FOR DEPOSITING AND REFLOW OF A HIGH QUALITY ETCH RESISTANT GAPFILL DIELECTRIC FILM

CROSS-REFERENCE TO RELATED APPLICATIONS

This application claims benefit of U.S. provisional patent application Ser. No. 62/633,935, filed Feb. 22, 2018, which is incorporated herein by reference in its entirety.

BACKGROUND

Field

Implementations described herein generally relate to a method for depositing a gapfill dielectric film that may be utilized for patterning processes such as multi-colored patterning processes.

Description of the Related Art

Semiconductor device processing is used to create integrated circuits that are present in electrical devices.

Conventionally, in the fabrication of integrated circuits, photolithography scanners using 193 nanometer (nm) wavelength lasers and numerical apertures of 1.35 have reached fundamental printing limits of 40 nm to 45 nm. However, there are demands and device trends for smaller feature sizes not obtainable by photolithography. Multi-color patterning processes are used to form lines, vias, trenches, contacts, devices, gates and other features on substrates Multi-color patterning processes form smaller features not obtainable by conventional photolithography processes.

In order to form features having smaller dimensions, such as sub-nano dimensions, gapfill layers are used to fill gaps formed between spacer layers disposed on mandrels formed on substrates. The spacer layers and/or mandrels are removed to form positive tones (lines) or negative tones (trenches) with small dimensions. Therefore, the gapfill layers should survive etching processes that remove the spacer layers and/or mandrels and should be thermally stable to withstand processing.

Accordingly, what is needed in the art are improved methods for forming gapfill layers.

SUMMARY

Implementations described herein generally relate to a method for depositing a gapfill dielectric film that may be utilized for multi-colored patterning processes. In one implementation, a method for processing a substrate is provided. The method comprises filling the one or more features of a substrate with a dielectric material. The dielectric material is a doped silicate glass selected from borophosphosilicate glass (BPSG), phosphosilicate glass (PSG), and borosilicate glass (BSG). The method further comprises treating the substrate with a high-pressure anneal in the presence of an oxidizer to heal seams within the dielectric material. The high-pressure anneal comprises supplying an oxygen-containing gas mixture on a substrate in a processing chamber, maintaining the oxygen-containing gas mixture in the processing chamber at a process pressure at greater than 2 bar and thermally annealing the dielectric material in the presence of the oxygen-containing gas mixture.

In another implementation, a method for processing a substrate is provided. The method comprises thermally treating a dielectric layer disposed on a substrate at a pressure greater than 2 bar The dielectric layer is a doped silicate glass selected from borophosphosilicate glass (BPSG), phosphosilicate glass (PSG), and borosilicate glass (BSG). The method further comprises maintaining a substrate temperature less than 500 degrees Celsius during thermally treating the dielectric layer.

In yet another implementation, a method of processing a substrate is provided. The method comprises forming a dielectric layer on a substrate by a chemical vapor deposition process. The dielectric layer is a doped silicate glass selected from borophosphosilicate glass (BPSG), phosphosilicate glass (PSG), and borosilicate glass (BSG). The method further comprises thermally treating the dielectric layer on the substrate at a pressure greater than 2 bar while maintaining the substrate temperature less than 500 degrees Celsius. The method further comprises exposing the substrate to a dry anneal process.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
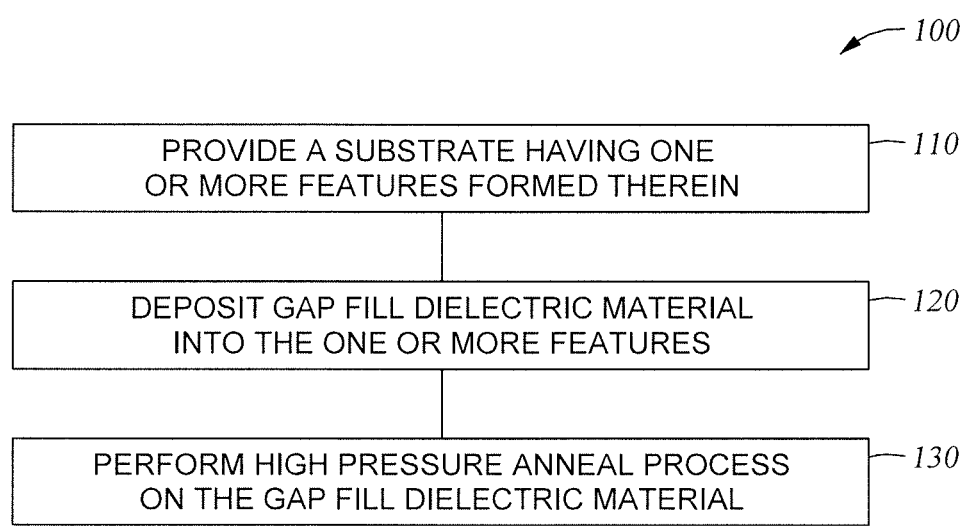
FIG. 1 is a flowchart of a method of processing a substrate according to one or more implementations of the present disclosure.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

The following disclosure describes high-pressure annealing processes that may be used to cure defects in gapfill dielectric films. Certain details are set forth in the following description and in FIGS. 1-3 to provide a thorough understanding of various implementations of the disclosure. Other details describing well-known structures and systems often associated with deposition of gapfill dielectric films and high-pressure annealing processes are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Implementations described herein will be described below in reference to a high-pressure annealing process that can be carried out using a high-pressure annealing process. Other tools capable of performing high-pressure annealing processes may also be adapted to benefit from the implementations described herein. In addition, any system enabling high-pressure annealing processes described herein can be used to advantage. The apparatus description described herein is illustrative and should not be construed or interpreted as limiting the scope of the implementations described herein.

There is a need for semi-compatible films with good gapfill to enable multi-color patterning by having high etch selectivity (e.g., >20:1) between the various materials. Doped silicate glass films (e.g., borophosphosilicate glass (BPSG), phosphosilicate glass (PSG), and borosilicate glass (BSG)) have good etch selectivity but poor gapfill at low temperatures since reflow occurs at temperatures greater than 700 degrees Celsius. State of the art processes use anneals at temperatures greater than 600 degrees Celsius in various ambient including steam to reflow borophosphosilicate glass (BPSG), phosphosilicate glass (PSG), and borosilicate glass (BSG). Despite superior etch selectivity, as thermal budgets decrease to temperatures below 500 degrees Celsius doped silicate glass films such as BPSG, BSG and PSG have fallen out of favor. Although dopant concentration can be increased to further reduce the thermal budget of these doped silicate glass films, increasing dopant concentration alone cannot achieve current thermal budgets of less than 500 degrees Celsius. Implementations of the present disclosure use a steam anneal performed at high pressures (e.g., greater than one atmosphere) to enable reflow of doped silicate glass films at a temperature less than 500 degrees Celsius. In some implementations, doped silicate glass is exposed to a multi-step anneal process. In one implementation, the multi-step anneal process includes—(1) exposing the doped silicate glass to a steam anneal at high pressure to enable reflow; and the (2) exposing the doped silicate glass to a dry environment anneal to eliminate any remaining moisture. The ability to use doped silicate glass films for gapfill at low thermal budgets provides a new material scheme for multi-color patterning to enable self-alignment.

Figure 2A:
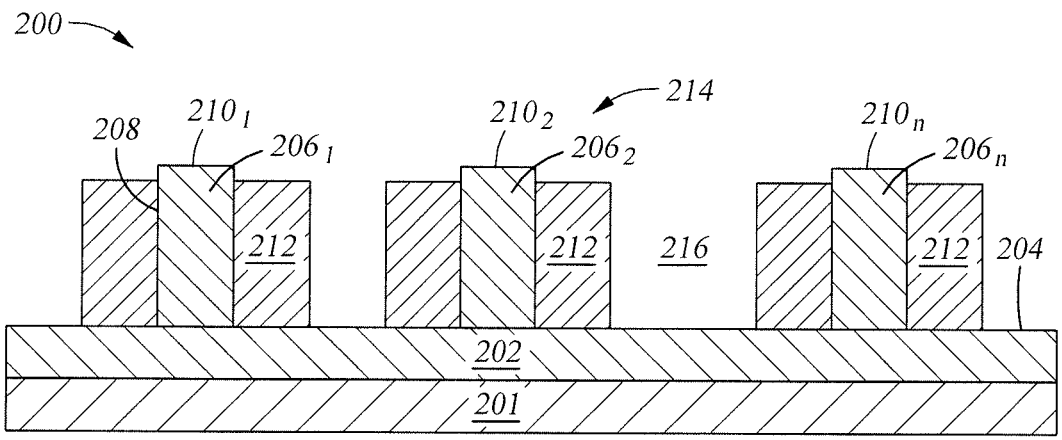
FIGS. 2A-2C are schematic, cross-sectional views of a pattern of a semiconductor device during the method for forming a pattern of a semiconductor device according to one or more implementations of the present disclosure.
Figure 2B:
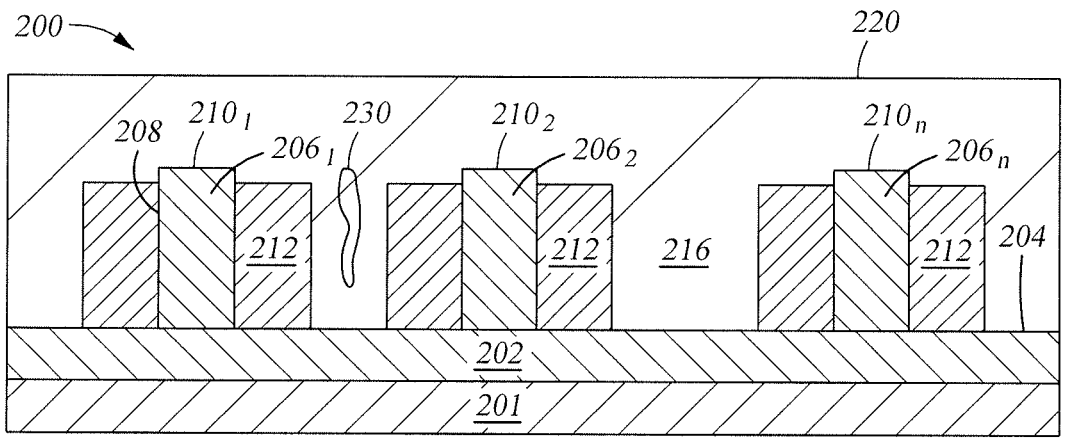
Figure 2C:
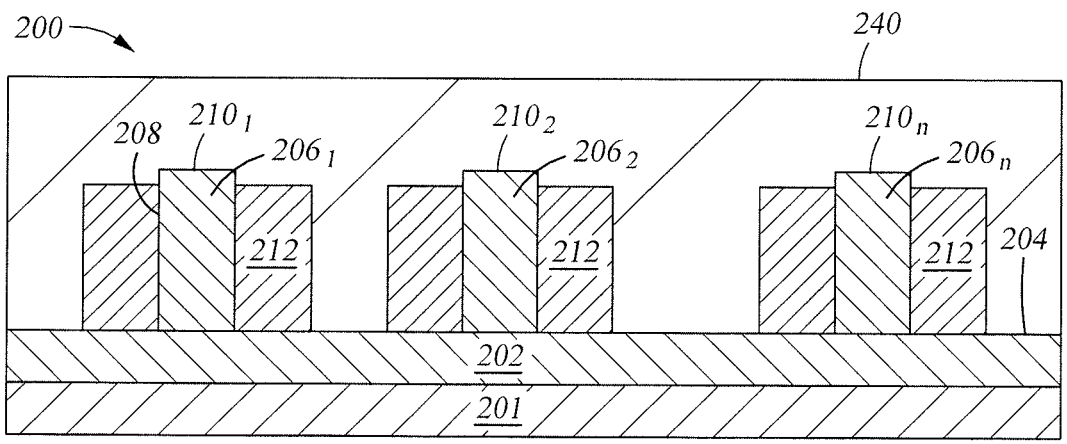

FIG. 1 is a flow diagram of a method 100 for processing a substrate, according to one or more implementations of the present disclosure. FIGS. 2A-2C are schematic sectional views of a substrate at stages of the method 100. To facilitate explanation of aspects of the present disclosure, FIGS. 2A-2C will be explained in conjunction with FIG. 1. It should be understood that the device structure depicted in FIGS. 2A-2C is only an example and that the method 100 may be used to process any structure where it is desirable to achieve seam-free gapfill at low thermal budgets.

At operation 110, a substrate 201 having one or more features formed therein is provided. The substrate 201 may be part of a semiconductor device, such as a semiconductor device 200. In one implementation, the substrate 201 includes a high-k material selected from a group comprising, consisting of, or consisting essentially of hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), platinum zirconium titanium (PZT), and combinations thereof. In one implementation, the substrate 201 includes a channel material. In one implementation, the channel material is selected from a group comprising, consisting of, or consisting essentially of germanium, silicon-germanium, and other III-V semiconductor materials. In one implementation, the substrate 201 includes a high-k metal gate material. In one implementation, the high-k metal gate material is selected from a group comprising, consisting of, or consisting essentially of titanium nitride (TiN), tantalum (Ta), titanium aluminum nitride (TiAlN), titanium silicon nitride (TiSiN), and combinations thereof. In one implementation, the substrate 201 includes a dielectric material. In one implementation, the dielectric material is selected from a group comprising, consisting of, or consisting essentially of silicon nitride (SiN), silicon carbide (SiC), silicon oxides (e.g., SiO, $SiO_2$, etc), and combinations thereof. During operation 110, the semiconductor device 200 is positioned in a process chamber. The process chamber is, for example, a deposition chamber. The semiconductor device 200 includes one or more patterned features. The patterned features are sometimes referred to as placeholders, mandrels or cores and have specific linewidths and/or spacings based upon the photoresist material used to etch the patterned features.

In one implementation, the semiconductor device 200 includes mandrels $206_1$, $206_2$ ... $206_n$ (collectively 206) formed on a first layer 202. The first layer 202 may be the substrate 201 or a layer disposed on the substrate 201. The first layer 202 has a surface 204. The first layer 202 may contain a silicon (Si) containing material, a silicon dioxide ($SiO_2$) containing material, or a silicon nitride (SiN) containing material. In one implementation, the mandrels $206_1$, $206_2$ ... $206_n$ are amorphous carbon (a-C) mandrels. In another implementation, the mandrels $206_1$, $206_2$ ... $206_n$ are amorphous silicon (a-Si) mandrels. As shown in FIG. 2A, the plurality of a-C mandrels 206 have a height of about 1 nanometer (nm) to about 100 nm from top surfaces $210_1$, $210_2$ ... $210_n$ (collectively 210) of the plurality of a-C mandrels 206 to the surface 204 of the first layer 202.

The semiconductor device 200 further includes a spacer layer 212 deposited over the plurality of a-C mandrels 206 and the first layer 202. In one implementation, the spacer layer 212 is amorphous silicon (a-Si). In another implementation, the spacer layer 212 is silicon nitride (SiN). The spacer layer 212 may contain a nitrogen (N) containing material or an oxygen (O) containing material. The spacer layer 212 may be conformally deposited on the top surfaces 210 and sidewalls 208 of the plurality of a-C mandrels 206 to form gaps 216 between respective facing portions 214 of the spacer layer 212 on the sidewalls 208 of the plurality of a-C mandrels 206. As shown in FIG. 2A, the gaps 216 have a width of about 1 nm to about 10 nm between the respective facing portions 214. In one implementation, the gaps 216 have an aspect ratio that is greater than 5:1. Portions of the spacer layer 212 have been removed to expose top surfaces 210 of the plurality of a-C mandrels 206 and to expose the first layer 202.

Referring to FIGS. 1 and 2B, the method 100 proceeds to operation 120 by performing a gapfill process to fill in the gaps 216 in the semiconductor device 200. The gaps 216 are filled with a dielectric material 220. In one implementation, the dielectric material 220 comprises a doped silicate glass. In one implementation, the doped silicate glass is selected from borophosphosilicate glass (BPSG), phosphosilicate glass (PSG), and borosilicate glass (BSG). The dielectric material 220 is deposited by any suitable technique that complies with thermal budget targets, such as, for example, chemical vapor deposition (CVD), plasma-enhanced chemical vapor deposition (PECVD), atomic layer deposition (ALD), epitaxial deposition, spin-on coating, flowable CVD (FCVD), and conformal film deposition (CFD). The as-deposited dielectric material 220 typically contains defects (e.g., voids or seams) 230 in the dielectric material 220.

In some implementations, the method 100 further includes applying a chemical mechanical polishing (CMP) process to remove excessive dielectric material and planarize the top surface of the dielectric material 220. In some implementations, the dielectric material 220 is exposed to a curing process.

Referring to FIG. 1, the method 100 proceeds to operation 130, where the semiconductor device 200 is exposed to a high-pressure annealing process. The annealing process of operation 130 is performed at a high process pressure, such as greater than 2 bar. The annealing process of operation 130 may assist densifying and repairing the vacancies in the dielectric material 220, forming a dielectric layer 240 with the targeted film properties, as shown in FIG. 2C. The high-pressure annealing process of operation 130 may be performed in a batch mode or a single wafer mode. The high-pressure annealing process of operation 130 may be performed in a processing chamber, such as processing chamber 300 depicted in FIG. 3, or other suitable processing chambers, including those that process substrates one at a time. The high-pressure annealing process of operation 130 may be performed in the processing region or high-pressure region of the processing chamber.

The high-pressure annealing process performed at operation 130 maintains processing pressure at the high-pressure region in a vapor phase, for example in a dry vapor phase that has substantially no liquid droplets present. In one implementation, the high-pressure annealing process of operation 130 is a high-pressure steam annealing process. The processing pressure and temperature is controlled to densify the film structures, so as to repair the film defects, driving out impurities and increasing film density. In one implementation, the high-pressure region is pressurized to a pressure greater than atmosphere, for example greater than about 2 bar. In one implementation, the high-pressure region is pressurized to a pressure greater than atmosphere, for example up to 250 bar. In another implementation, the high-pressure region is pressurized to a pressure from about 5 bar to about 100 bar. In yet another implementation, the high-pressure region is pressurized to a pressure from about 5 bar to about 75 bar, such as a pressure from about 50 bar to about 75 bar. As the high-pressure may efficiently assist densifying the film structure at a relatively low processing temperature, such as less than 500 degrees Celsius, to reduce the likelihood of thermal cycle damage to the semiconductor device 200.

During processing, the high-pressure region is maintained at a relatively low temperature, for example, a temperature less than 500 degrees Celsius, such as between about 150 degrees Celsius and about 400 degrees Celsius, by the heaters disposed within the processing chamber. Thus, a low thermal budget to the substrate may be obtained by utilizing the high-pressure annealing process along with low temperature regime.

It is believed that the high-pressure process may provide a driving force to drive out the dangling bonds in the dielectric material 220, thus, repairing, reacting and saturating the dangling bonds in the dielectric material 220 during the annealing process. In one implementation, an oxygen-containing gas, such as $O_3$ gas, $O_2$ gas, $H_2O$, $H_2O_2$, $N_2O$, $NO_2$, $CO_2$, $CO$, dry steam, or other suitable gases may be supplied during the annealing process. In one implementation, the oxygen-containing gas comprises steam, for example, dry steam. In one implementation, the steam is formed from heated liquid water. In another implementation, the steam is formed from the reaction between hydrogen and oxygen. The oxygen elements from the oxygen-containing gas during the annealing process may be driven into the dielectric material 220, altering the bonding structures and removing the atomic vacancies therein, thus, densifying and enhancing lattice structures of the dielectric material 220 to form a dielectric layer 240 which is substantially free from seams and voids. In some implementations, inert gas, such as Ar, $N_2$, He, Kr and the like, may be supplied with the oxygen-containing gas. In one implementation, the oxygen-containing gas supplied in the oxygen-containing gas mixture is dry steam supplied at a pressure greater than 2 bar.

In one implementation, a process pressure is regulated at a pressure greater than 2 bar, such as between 5 bar and 100 bar, such as between 20 bar and about 80 bar, such as between about 25 bar and 75 bar, for example between about 50 bar and about 75 bar. The process temperature may be controlled at greater than 150 degrees Celsius but less than 500 degrees Celsius, such as between about 150 degrees Celsius and about 400 degrees Celsius, such as between about 180 degrees Celsius and about 350 degrees Celsius. In one implementation, after positioning the semiconductor device 200 in the high-pressure annealing chamber, both temperature and pressure are simultaneously ramped to the targeted annealing pressure and the targeted annealing temperature. In another implementation, after positioning the semiconductor device 200 in the high-pressure annealing chamber, the temperature is ramped to the targeted annealing temperature followed by ramping the pressure to the targeted annealing pressure. In yet another implementation, after positioning the semiconductor device 200 in the high-pressure annealing chamber, the pressure is ramped to the targeted annealing pressure followed by ramping the temperature to the targeted annealing temperature.

In another implementation, the semiconductor device 200 including the dielectric layer 240 is exposed to a dry annealing process (i.e., no steam). Not to be bound by theory, but it is believed that the boron in BPSG tends to form crystallites and that the dry anneal eliminates the crystallites. In one implementation, the dry annealing process is performed at a temperature less than 800 degrees Celsius. In one implementation, the dry annealing process is performed at a temperature less than 500 degrees Celsius. In one implementation, the dry annealing process is performed with a temperature in the range from about 150 degrees Celsius to about 400 degrees Celsius and with duration in the range from about one second to about 10 minutes. In one implementation, the dry anneal is performed in the same pressure ranges as the high-pressure anneal of operation 130. In one implementation, the dry anneal is performed in an inert gas atmosphere. In one implementation, the inert gas atmosphere is a nitrogen gas atmosphere. In one implementation, the high-pressure steam anneal and the dry anneal are performed in the same chamber. In another implementation, the high-pressure steam anneal and the dry anneal are performed in separate chambers.

In one implementation, the dry annealing process is a spike annealing process. The spike annealing process has a short time duration and is applied to the dielectric layer 240 in the semiconductor device 200 to enhance the effect of the high-pressure annealing process. The spike annealing process may be a rapid thermal anneal (RTA), a laser anneal, and/or a flash lamp anneal. In one implementation, the spike annealing process is performed with a temperature in the range from about 150 degrees Celsius to about 400 degrees Celsius and with duration in the range from about one second to about 10 minutes.

After the annealing process, the dielectric layer 240 has a densified film structure, which provides a relatively robust film structure that provides an improved wet etching rate (compared to a porous film structure often having a high wet etching rate).

At the conclusion of method 100, further processing may be performed thereafter to the pattern of the semiconductor device 200.

Figure 3:
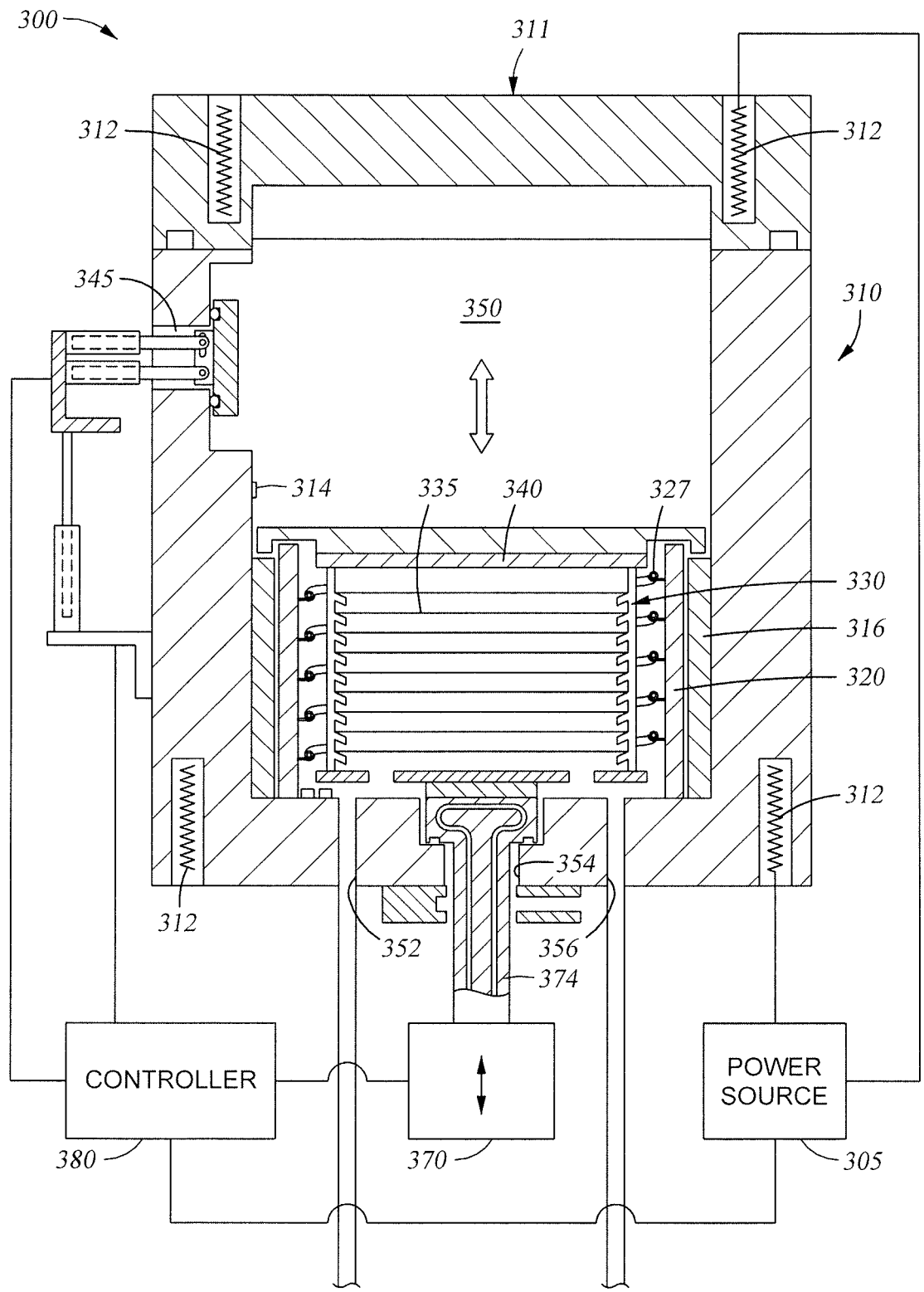
FIG. 3 is a schematic sectional view of an exemplary processing chamber that may be used to practice the methods described herein.

FIG. 3 is a schematic sectional view of the exemplary processing chamber 300, which may be used to practice the method 100 described herein. Although the processing chamber 300 depicted in FIG. 3 includes a batch of substrates that may be simultaneously processed in the processing chamber, it is noted that the processing chamber 300 may be configured to process a single substrate in each process as needed.

The processing chamber 300 may be configured to form the dielectric layer, such as the dielectric layer 240 depicted in FIG. 2, which will be described further in detail below, under a high-pressure control, such as greater than 2 bar.

The processing chamber 300 has a cassette 330 disposed in an internal volume 350 for processing a plurality of substrates 335. The processing chamber 300 has a chamber body 310 enclosing the internal volume 350, and a lid 311 disposed on the chamber body 310. One or more heaters 312 are disposed within the chamber body 310. The heaters 312, such as resistive heaters, are configured to heat the chamber body 310. Power to the heaters 312 is supplied by a power source 305 and controlled by the controller 380. A shell 320 is disposed within the internal volume 350. An insulating liner 316 is disposed in the internal volume 350 surrounding the shell 320. The insulating liner 316 prevents heat transfer between chamber body 310 and the shell 320.

The cassette 330 couples to a shaft 374 which extends through an opening 354 in the chamber body 310. The cassette 330 is moveably disposed within the internal volume 350 by an actuator 370 coupled to the shaft 374. The cassette 330 facilitates transfer of substrates 335 between a loading position and a processing position. Substrates 335 are transferred into and out of the internal volume 350 thorough a loading port 345 formed in the chamber body 310. The shell 320 couples to the lid 340 of the cassette 330 when the cassette 330 is in the processing position and defines a processing region wherein the substrates 335 are annealed at an elevated pressure and an elevated temperature.

During processing, a processing fluid, such as an oxygen-containing gas (e.g., steam), is flowed into the processing region through an inlet port 352. The inlet port 352 is in fluid communication with the substrates 335 through a plurality of apertures in the cassette 330. Heaters 327, disposed within the processing region, are configured heat the processing region and the substrates 335 therein. The pressure and temperature within the processing region are raised in order to anneal the substrates 335 therein. The processing fluid is evacuated from the processing region through an outlet port 356.

In one implementation, the controller 380 is coupled to a plurality of sensors 314, such as temperature sensors or pressure sensors. The sensors 314 provide signals to the controller to indicate the conditions within the internal volume 350. The controller 380 controls the flow of the processing fluid as well as the power supplied to the heaters 312, 327 to process the substrates 335 in a targeted manner.

In operation, a processing fluid is introduced through the inlet port 352. The processing fluid is removed through the outlet port 356 using a pump (not shown). During processing of the substrates 335 an environment of the pressure region is maintained at a temperature and pressure that maintains the processing fluid within the processing region in a vapor phase. Such pressure and temperature is selected based on the composition of the processing fluid. In the case of steam, the temperature and pressure is held at a condition that maintains the steam in a dry steam state. In one example, the processing region is pressurized to a pressure greater than atmosphere, for example greater than about 2 bar. In another example, the processing region is pressurized to a pressure greater than atmosphere, for example up to about 250 bar. In another implementation, the processing region is pressurized to a pressure from about 5 bar to about 100 bar. In yet another implementation, the processing region is pressurized to a pressure from about 5 bar to about 75 bar, such as a pressure from about 50 bar to about 75 bar. During processing, the processing region is also maintained at a high temperature, for example, a temperature exceeding 225 degrees Celsius (limited by the thermal budget of the substrates 335 disposed on the cassette 330), such as between about 300 degrees Celsius and about 450 degrees Celsius, by the heaters 312, 327. Exposure to the processing fluid at a high-pressure while the substrates 335 are maintained at a high temperature causes reflow of the dielectric gapfill material to reduce the formation of seams in the dielectric gapfill material.

In some implementations, the method described herein results in a high quality doped silicon glass film that functions as a gapfill material that is substantially free of seams or voids. Conventional anneal methods, such as furnace annealing, result in poor distribution of the oxygen through the oxide layer. The oxygen only penetrates a shallow area near the surface of the layer in such conventional methods. The inventors of the disclosure have found that the use of a high-pressure anneal in the presence of an oxidizer promotes conformal oxidation of the layer. That is, the layer is oxidized in a substantially uniform manner across the entirety of the layer thereby increasing uniformity of the distribution of oxygen throughout the layer. Further, the uniformity of the densification of the oxide layer is increased by the methods described herein. The uniform densification also typically results in improved etch selectivity. Some implementations of the present disclosure use a steam anneal performed at high pressures (e.g., greater than one atmosphere) to enable reflow of doped silicate glass films at a temperature less than 500 degrees Celsius. In some implementations, doped silicate glass is exposed to a multi-step anneal process. In some implementations, the multi-step anneal process includes—(1) exposing the doped silicate glass to a steam anneal at high pressure to enable reflow; and the (2) exposing the doped silicate glass to a dry environment anneal to eliminate any remaining moisture. The ability to use doped silicate glass films for gapfill at low thermal budgets provides a new material scheme for multi-color patterning to enable self-alignment.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

While the foregoing is directed to implementations of the present disclosure, other and further implementations of the disclosure may be devised without departing from the basic scope thereof, and the scope thereof is determined by the claims that follow.

The invention claimed is:

1. A method, comprising:
   filling one or more features formed over a substrate with a borophosphosilicate glass (BPSG) material;
   treating the substrate with a high-pressure anneal in the presence of an oxidizer to heal seams within the BPSG material, comprising:
     supplying an oxygen-containing gas mixture into a processing chamber containing the substrate; and
     thermally annealing the BPSG material in the presence of the oxygen-containing gas mixture to oxidize the BPSG material while maintaining the oxygen-containing gas mixture in the processing chamber at a process pressure greater than 2 bar; and
   exposing the BPSG material to a dry anneal process to eliminate moisture.

2. The method of claim 1, wherein thermally annealing the BPSG material further comprises:
   maintaining the substrate at a substrate temperature less than 500 degrees Celsius.

3. The method of claim 1, wherein the oxygen-containing gas mixture comprises an oxygen-containing gas selected from $O_3$ gas, $O_2$ gas, $H_2O$, $H_2O_2$, $N_2O$, $NO_2$, $CO_2$, CO, dry steam.

4. The method of claim 1, wherein the oxygen-containing gas mixture comprises dry steam.

5. The method of claim 1, wherein the process pressure is between 5 bar and 100 bar.

6. The method of claim 1, wherein the substrate comprises a high-k material selected from hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT).

7. The method of claim 1, wherein the BPSG material is formed by a chemical vapor deposition process.

8. The method of claim 1, wherein the BPSG material has a higher film density after thermally annealing the BPSG material.

9. A method, comprising:
   providing a device, comprising:
     a first layer having a plurality of mandrels formed thereon, wherein the mandrels are defined by a top surface and at least one sidewall; and
     a patterned spacer layer conformally deposited on the at least one sidewall of the mandrels to form gaps between respective facing portions of the patterned spacer layer formed on the sidewalls of the mandrels;
   filling the gaps with a dielectric material, wherein the dielectric material is a doped silicate glass selected from borophosphosilicate glass (BPSG), phosphosilicate glass (PSG), and borosilicate glass (BSG);
   thermally treating the dielectric material at a process pressure greater than 2 bar;
   maintaining a substrate temperature less than 500 degrees Celsius during thermally treating the dielectric material; and exposing the thermally treated dielectric material to a dry anneal process to eliminate moisture.

10. The method of claim 9, further comprising:
    supplying dry steam to the dielectric material while thermally treating the dielectric material to oxidize the dielectric material.

11. The method of claim 10, wherein the dielectric material has a higher density after being thermally treated.

12. The method of claim 11, wherein the doped silicate glass is borophosphosilicate glass (BPSG).

13. The method of claim 9, wherein the first layer is formed on a substrate and the substrate comprises a high-k material selected from hafnium dioxide ($HfO_2$), zirconium dioxide ($ZrO_2$), hafnium silicon oxide ($HfSiO_2$), hafnium aluminum oxide (HfAlO), zirconium silicon oxide ($ZrSiO_2$), tantalum dioxide ($TaO_2$), aluminum oxide, aluminum doped hafnium dioxide, bismuth strontium titanium (BST), and platinum zirconium titanium (PZT).

14. The method of claim 9, wherein the process pressure is between about 5 bar and 100 bar.

15. The method of claim 9, wherein the dielectric material contacts at least one top surface of the mandrels and at least one facing portion of the patterned spacer layer.

16. The method of claim 15, wherein the first layer comprises silicon oxide or silicon nitride.

17. The method of claim 16, wherein the mandrels are amorphous carbon mandrels or amorphous silicon mandrels.

18. A method, comprising:
    forming a borophosphosilicate glass (BPSG) layer over a substrate by a chemical vapor deposition process;
    exposing the BPSG layer to steam at a pressure greater than 2 bar while maintaining a substrate temperature less than 500 degrees Celsius to enable reflow of the BPSG layer;
    exposing the BPSG layer to a dry anneal process to eliminate moisture; and
    planarizing a top surface of the BPSG layer by exposing the BPSG layer to a chemical mechanical polishing process to remove excess BPSG material from the BPSG layer.

19. The method of claim 18, wherein the steam is maintained in a dry steam state.

20. The method of claim 19, wherein the BPSG layer has a higher density after being exposed to the steam.

* * * * *